United States Patent [19]

Oguchi

[11] Patent Number: 5,128,533

[45] Date of Patent: Jul. 7, 1992

[54] PHOTOELECTRIC CONVERTING APPARATUS

[75] Inventor: Takahiro Oguchi, Atsugi, Japan

[73] Assignee: Canon Kabushiki Kaisha, Tokyo, Japan

[21] Appl. No.: 506,000

[22] Filed: Apr. 9, 1990

[30] Foreign Application Priority Data

Apr. 10, 1989 [JP] Japan .................................. 1-087894

[51] Int. Cl.⁵ .............................................. H01J 40/14
[52] U.S. Cl. ............................. 250/208.1; 358/213.11
[58] Field of Search ............................ 250/208.1, 226;
357/24 LR, 30 G, 30 H; 358/213.11, 213.13, 213.14

[56] References Cited

U.S. PATENT DOCUMENTS

| | | | |
|---|---|---|---|
| 4,471,228 | 9/1984 | Nishizawa et al. | 250/208.1 |
| 4,763,189 | 8/1988 | Komatsu et al. | |
| 4,764,813 | 8/1988 | Murajama et al. | 358/213.11 |
| 4,857,751 | 8/1989 | Hatanaka et al. | 250/208.1 |
| 4,868,405 | 9/1989 | Nakamura | 358/213.11 |
| 4,954,703 | 9/1990 | Ohzu | 250/208.1 |
| 4,959,723 | 9/1990 | Hashimoto | 358/213.11 |

FOREIGN PATENT DOCUMENTS

| | | |
|---|---|---|
| A173413 | 5/1986 | European Pat. Off. . |
| 61-255062 | 8/1985 | Japan . |
| 62-147766 | 7/1987 | Japan . |

Primary Examiner—David C. Nelms
Assistant Examiner—Que T. Le
Attorney, Agent, or Firm—Fitzpatrick, Cella, Harper & Scinto

[57] ABSTRACT

There is provided a photoelectric converting apparatus having a plurality of photoelectric conversion device lines and a plurality of scanning circuits corresponding to the plurality of photoelectic conversion device lines, wherein the plurality of photoelectric conversion device lines and the plurality of scanning circuits are connected by wirings.

19 Claims, 8 Drawing Sheets

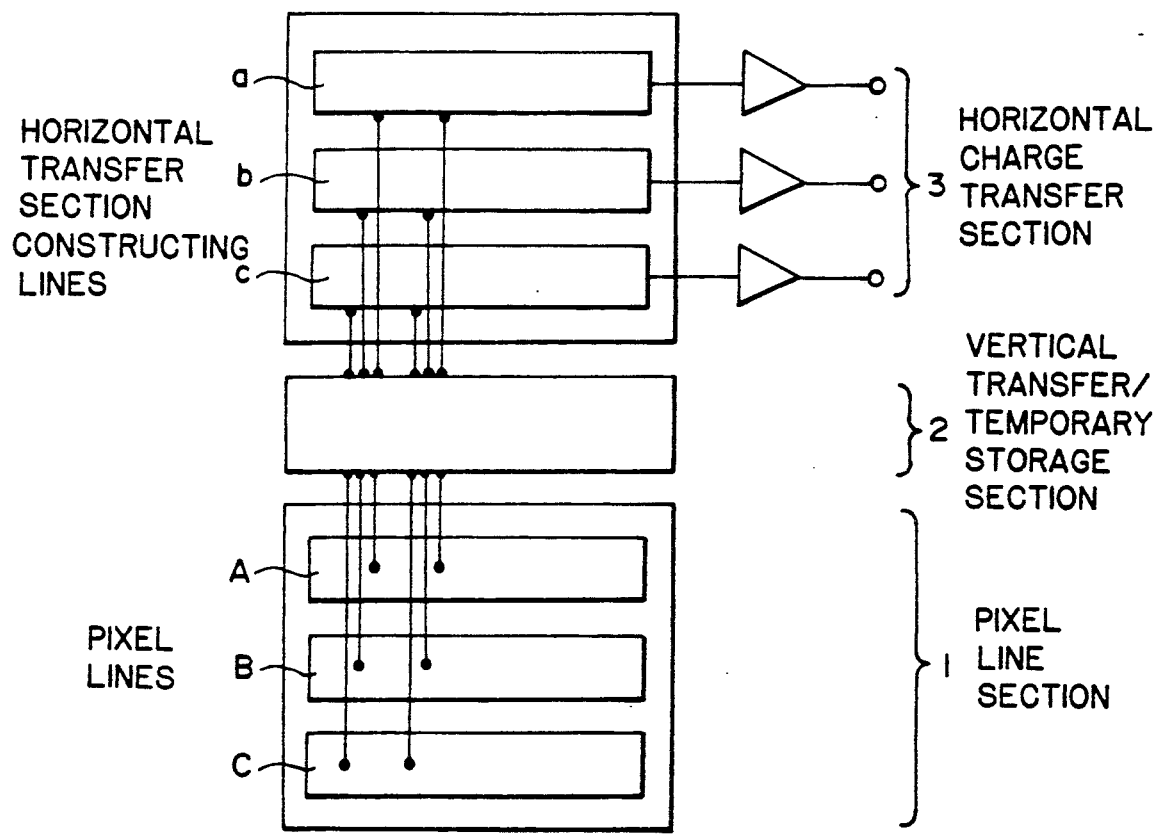
F I G. 1

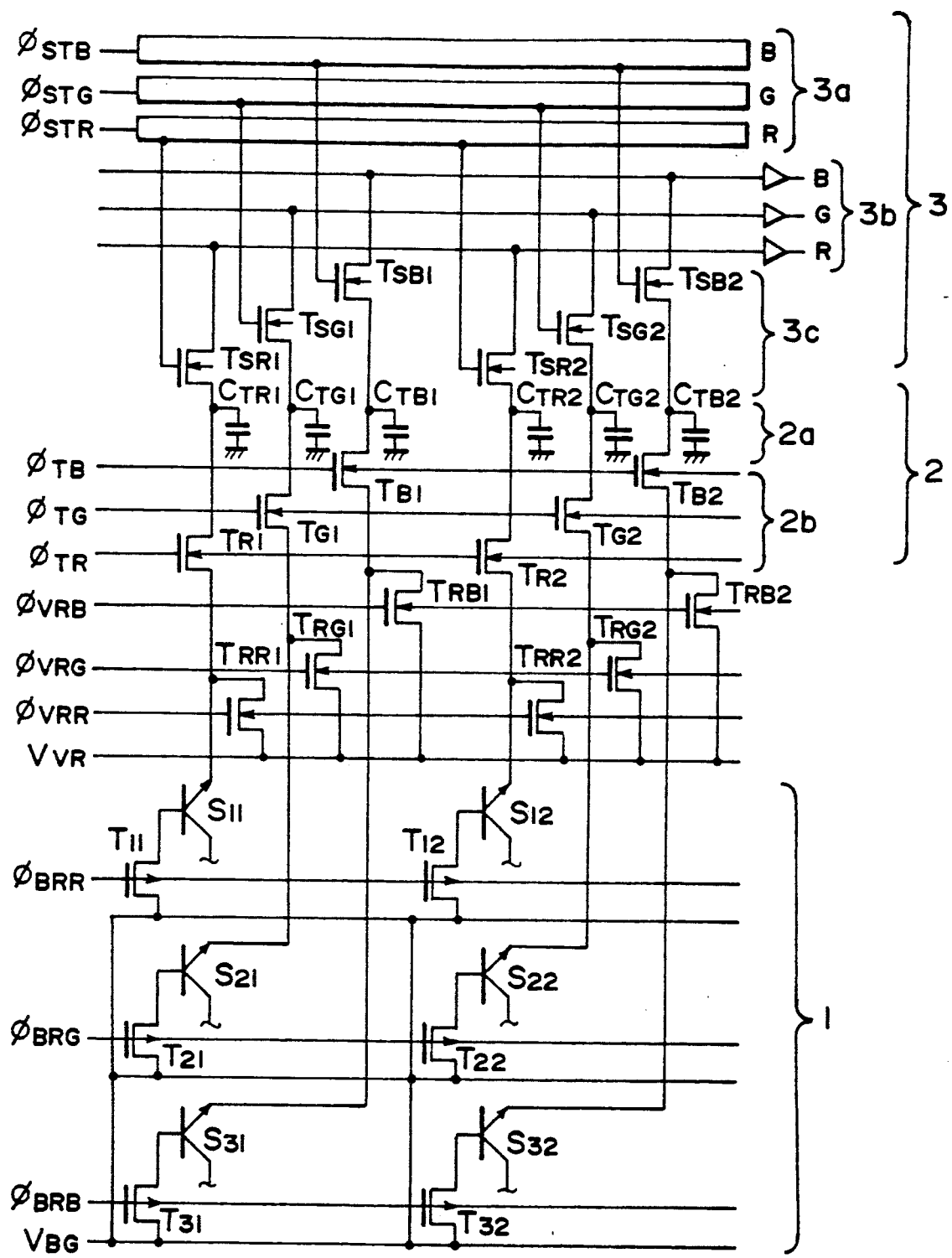
F I G. 2

PHOTOELECTRIC CONVERTING APPARATUS

BACKGROUND OF THE INVENTION

1. Field of the Invention

The present invention relates to a photoelectric converting apparatus and, more particularly, to a photoelectric converting apparatus having a plurality of photoelectric conversion device lines in which a signal can be independently output from each of the photoelectric conversion device lines.

2. Related Background Art

A photoelectric converting apparatus to read a color image is generally constructed by three pixel lines having three different spectral sensitivities. The pixel lines scan an original, so that the original is read. At this time, to obtain image information at a certain position (P) on the original, on the system side, it is necessary to record the information for a period of time when the three pixel lines scan the position P. This is because it is necessary to store the information from all of the pixel lines since the timings to obtain the image information at the position P of the pixel lines are different.

A recording capacity M which is necessary to store the information needs to be set to $M = N \cdot d/p$ (N: the number of pixels, d: distance between pixel lines, p: pitch of the pixels constructing the pixel line) with respect to one pixel line. In this case, to keep a resolution constant and to reduce M, it is desirable to reduce d.

A conventional photoelectric converting apparatus (disclosed in JP-A-62-147766) in which the distance d between pixel lines is reduced will be shown below.

FIG. 7A is an explanatory diagram of a construction of the conventional photoelectric converting apparatus and FIG. 7B is a partial enlarged diagram of such a photoelectric converting apparatus.

As shown in FIG. 7A, three different pixel lines A, B, and C are arranged adjacently, charge transfer means $a_1$, $b_1$, and $c_1$ are arranged on one side, and charge transfer means $a_2$, $b_2$, and $c_2$ are arranged on the other side. The pixels constructing the pixel lines A, B, and C are alternately divided into the pixels whose signals are transferred to the charge transfer means $a_1$, $b_1$, and $c_1$ and the pixels whose signals are transferred to the charge transfer means $a_2$, $b_2$, and $c_2$. As shown in FIG. 7B, the pitch of the pixels is set to p and the distance between the pixel lines is set to d.

In the photoelectric converting apparatus of the above construction, the signal transfer among the pixel lines A, B, and C and the signal transfer among the charge transfer means $a_1$ to $c_2$ are executed by transfer gates $T_7$ to $T_{14}$ provided among the pixel lines A, B, and C and among the charge transfer means $a_1$ to $c_2$.

In the above constructional example, after the elapse of a predetermined storage period $T_0$, by turning on/off the transfer gates respectively at three different timings, the photo charges generated by the pixel lines A, B, and C are vertically transferred to the charge transfer means $a_1$ to $c_2$ in a short time and, thereafter, they are horizontally transferred. In the photoelectric converting apparatus of the above construction, since only the transfer gates merely exist among the pixel lines, the distance d between the pixel lines can be reduced.

However, in the conventional example, since the transfer of the signals from the pixel lines A, B, and C to the horizontal transfer sections $a_1$ to $c_2$ is executed through the photoelectric converting section (storage section) of each pixel line by using the vertical gates, the vertical transfer operations regarding the pixel lines A, B, and C are executed in a lump at the same timing. Therefore, three pixel lines cannot be independently driven.

SUMMARY OF THE INVENTION

It is an object of the invention to solve the problems of the conventional technique as mentioned above and to provide a photoelectric converting apparatus which can independently read out each of color signals.

A photoelectric converting apparatus of an embodiment according to the invention has a plurality of photoelectric conversion device lines and a plurality of scanning circuits corresponding to the plurality of photoelectric conversion device lines, wherein the plurality of photoelectric conversion device lines and the plurality of scanning circuits are connected.

With the above construction, the storage of the signal charges in each of the photoelectric conversion device lines and the transfer of the stored signal charges can be independently performed.

BRIEF DESCRIPTION OF THE DRAWINGS

FIG. 1 is an explanatory diagram showing an example of a construction of a photoelectric converting apparatus according to the present invention;

FIG. 2 is a circuit diagram showing one circuit construction of the photoelectric converting apparatus;

DETAILED DESCRIPTION OF THE PREFERRED EMBODIMENTS

Figure 3:
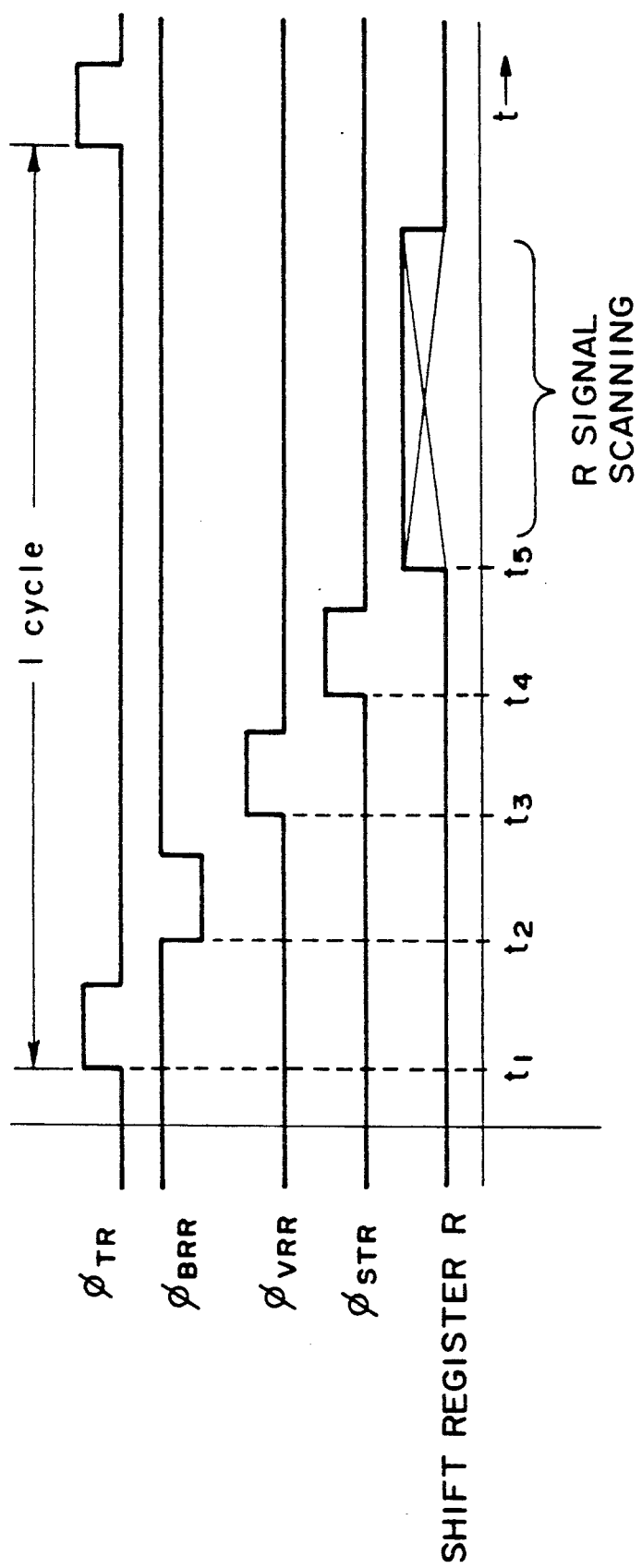
FIG. 3 is a timing chart showing the operation of a pixel line R as one pixel line of the photoelectric converting apparatus with the above circuit construction.

An embodiment of the present invention will be described in detail hereinbelow with reference to the drawings.

FIG. 1 is an explanatory diagram showing an example of a construction of a photoelectric converting apparatus of the invention.

As shown in the diagram, the pixel lines A, B, and C of a pixel line section 1 as a photoelectric conversion device line are connected to a vertical transfer/temporary storage section 2 through wirings, respectively. The storage section 2 is connected to each of horizontal transfer section constructing lines a, b, and c of a horizontal charge transfer section 3 through wirings, respectively. The vertical transfer/temporary storage section 2 and horizontal charge transfer section 3 construct a scanning circuit.

In the above example of the construction, since the signal charges stored in each pixel line are transferred to the horizontal charge transfer section 3 through the wiring without passing through the other pixel lines, the signal charges can be sent independently of the other pixel lines.

FIG. 2 is a circuit diagram showing one circuit construction of the photoelectric converting apparatus.

As shown in the diagram, the pixel line section 1 is constructed by three lines of R (red), G (green), and B (blue). Photoelectric converters $S_{11}$ to $S_{32}$ of each pixel line are constructed by photo transistors.

MOS transistors $T_{11}$ to $T_{32}$ are connected to bases of the photoelectric converters $S_{11}$ to $S_{32}$ of each of the pixel line section 1 of R, G, and B. Pulses $\phi_{BRR}$, $\phi_{BRG}$, and $\phi_{BRB}$ are applied every pixel line of R, G, and B. The MOS transistors $T_{11}$ to $T_{32}$ are on/off controlled and a predetermined voltage $V_{BG}$ is applied to their drains. Emitters of the photoelectric converters $S_{11}$, $S_{21}$, and $S_{31}$ are connected to temporary storage capacitors $C_{TR1}$, $C_{TG1}$, and $C_{TB1}$ through MOS transistors $T_{R1}$, $T_{G1}$, and $T_{B1}$ and are also connected to a reset potential $V_{VR}$ through MOS transistors $T_{RR1}$, $T_{RG1}$, and $T_{RB1}$ to execute the resetting operation. The temporary storage capacitors $C_{TR1}$, $C_{TG1}$, and $C_{TB1}$ are connected to output signal lines R, G, and B through MOS transistors $T_{SR1}$, $T_{SG1}$, and $T_{SB1}$ which are controlled by shift registers R, G, and B.

In a manner similar to the above, emitters of the photoelectric converters $S_{12}$ to $S_{32}$ are connected to temporary storage capacitors $C_{TR2}$, $C_{TG2}$, and $C_{TB2}$ through MOS transistors $T_{R2}$, $T_{G2}$, and $T_{B2}$ and are also connected to MOS transistors $T_{RR2}$, $T_{RG2}$, and $T_{RB2}$ to execute the resetting operation. The temporary storage capacitors $C_{TR2}$, $C_{TG2}$, and $C_{TB2}$ are connected to the output signal lines R, G, and B through MOS transistors $T_{SR2}$, $T_{SG2}$, and $T_{SB2}$ which are controlled by the shift registers R, G, and B.

Pulses $\phi_{VRR}$, $\phi_{VRG}$, and $\phi_{VRB}$ control the MOS transistors $T_{RR1}$, $T_{RG1}$, $T_{RB1}$, $T_{RR2}$, $T_{RG2}$, and $T_{RB2}$. Pulses $\phi_{TR}$, $\phi_{TG}$, and $\phi_{TB}$ control the MOS transistors $T_{R1}$, $T_{G1}$, $T_{B1}$, $T_{R2}$, $T_{G2}$, and $T_{B2}$. Pulses $\phi_{STR}$, $\phi_{STG}$, and $\phi_{STB}$ control the MOS transistors $T_{SR1}$, $T_{SG1}$, $T_{SB1}$, $T_{SR2}$, $T_{SG2}$, and $T_{SB2}$ through the shift registers R, G, and B.

The MOS transistors $T_{R1}$, $T_{G1}$, $T_{B1}$, $T_{R2}$, $T_{G2}$, and $T_{B2}$ construct a vertical transfer gate section 2b. The temporary storage capacitors $C_{TR1}$, $C_{TG1}$, $C_{TB1}$, $C_{TR2}$, $C_{TG2}$, and $C_{TB2}$ construct a temporary storage capacitor section 2a. The vertical transfer gate section 2b and the temporary storage capacitor section 2a construct the vertical transfer/temporary storage section 2.

On the other hand, the MOS transistors $T_{SR1}$, $T_{SG1}$, $T_{SB1}$, $T_{SR2}$, $T_{SG2}$, and $T_{SB2}$ construct a horizontal transfer gate section 3c. The output signal lines R, G, and B construct an output signal line section 3b. The shift registers R, G, and B construct a shift register section 3a. The shift register section 3a, the output signal line section 3b, and the horizontal transfer gate section 3c construct the horizontal charge transfer section 3.

FIG. 3 is a timing chart showing the operation of the pixel line R as one of the pixel lines of the photoelectric converting apparatus of the above circuit construction.

As shown in the diagram, when the pulse $\phi_{TR}$ is applied at time $t_1$ and the MOS transistors $T_{R1}$ and $T_{R2}$ are vertical transfer gates are turned on, the photo signals at the pixels of the pixel line R are transferred in a lump to the temporary storage capacitors $C_{TR1}$ and $C_{TR2}$. After that, the base potential in the photo transistor constructing section as a photoelectric converter is reset (complete reset) to $V_{BG}$ by applying the pulse $\phi_{BRR}$ at time $t_2$. Further, by applying the pulse $\phi_{VRR}$ at time $t_3$, the emitter potential is reset (transient reset) to $V_{VR}$. The time which is required from the end of the transient reset to the supply of the next vertical transfer pulse $\phi_{TR}$ corresponds to the storage time of the signal charges which are subsequently read out.

The photo signals which were transferred to the temporary storge capacitors at time $t_1$ are output to the output signal line R by the amount of each bit by the scanning pulse from the shift register R at time $t_5$ after the start clock $\phi_{STR}$ of the shift register R was applied at time $t_4$.

Although the operation of the pixel line R has been described above, the other pixel lines can be also operated at similar drive timings.

According to the invention, as mentioned above, since the outputs are scanned by using three independent scanning circuits of R, G, and B, there is no limitation in the drive timings of R, G, and B and the three pixel lines can be completely independently driven.

Figure 4:
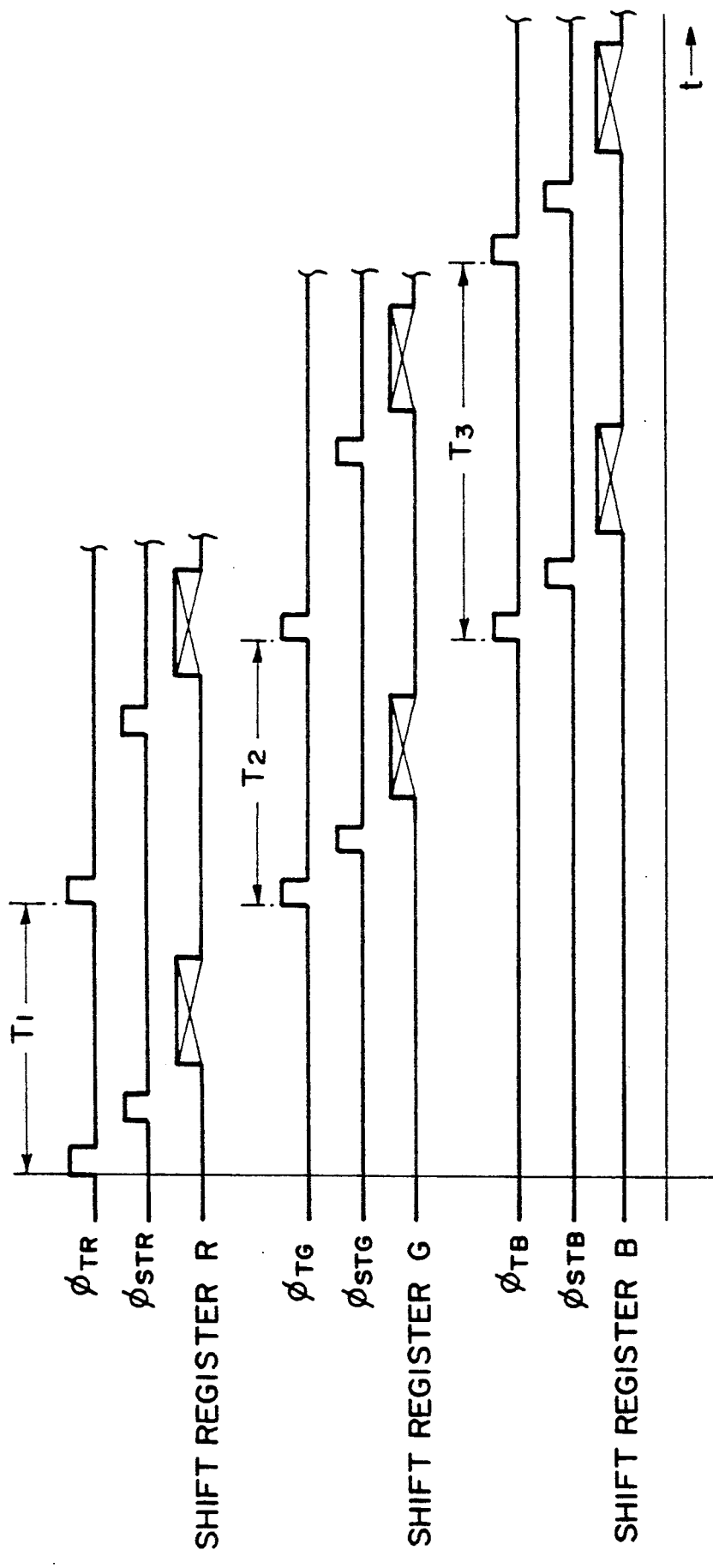
FIG. 4 is a timing chart to independently drive pixel lines R, G, and B.

FIG. 4 is a timing chart for independently driving the pixel lines R, G, and B.

The pulses $\phi_{BRR}$, $\phi_{BRG}$, and $\phi_{BRB}$ to execute the complete reset and the pulses $\phi_{VRR}$, $\phi_{VRG}$, and $\phi_{VRB}$ to perform the transient reset are omitted for simplicity of the drawing.

As shown in the diagram, in the embodiment, the time which is required from the supply of a vertical transfer pulse $\phi_T$ to the supply of the next vertical transfer pulse $\phi_T$ with respect to the pixel line B is set to be longer than those of the other pixel lines R and G ($T_3 > T_1, T_2$). The storage time of the signal charges of B is longer than those of R and G. As mentioned above, in the invention, the storage time of the signal charges can be arbitrarily changed in accordance with the sensitivity or the like of the photo transistor constructing section as a photoelectric converter.

In the above embodiment, although the photoelectric converter is constructed by the photo transistor, it can be also replaced by other photoelectric conversion device such as a photo diode. The temporary storage capacitors $C_{TR1}$, $C_{TG1}$, $C_{TB1}$, $C_{TR2}$, $C_{TG2}$, and $C_{TB2}$ shown in FIG. 2 can be also omitted.

Figure 5A:
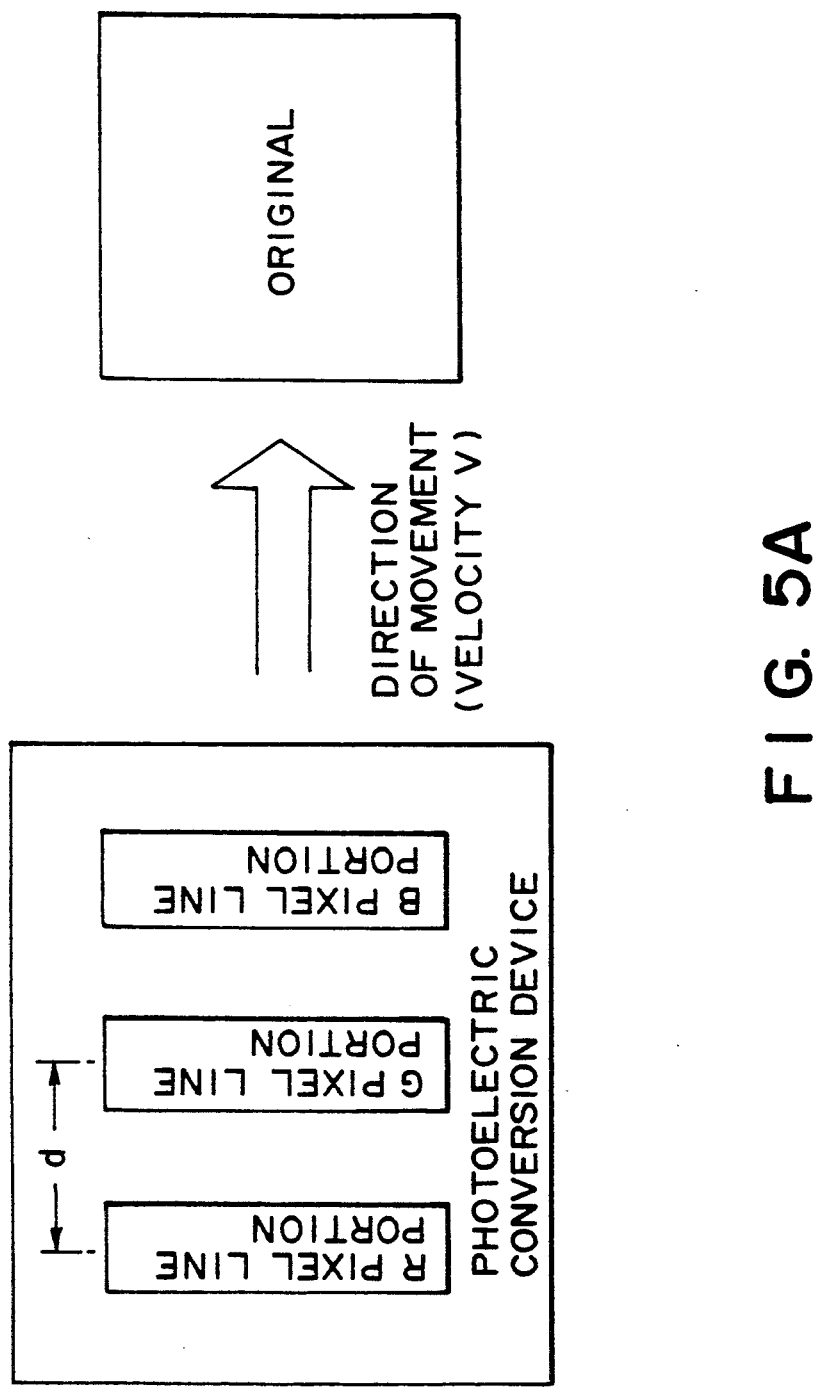
FIGS. 5A and 5B are explanatory diagrams showing another embodiment to independently drive the pixel lines A, B, and C.
Figure 5B:
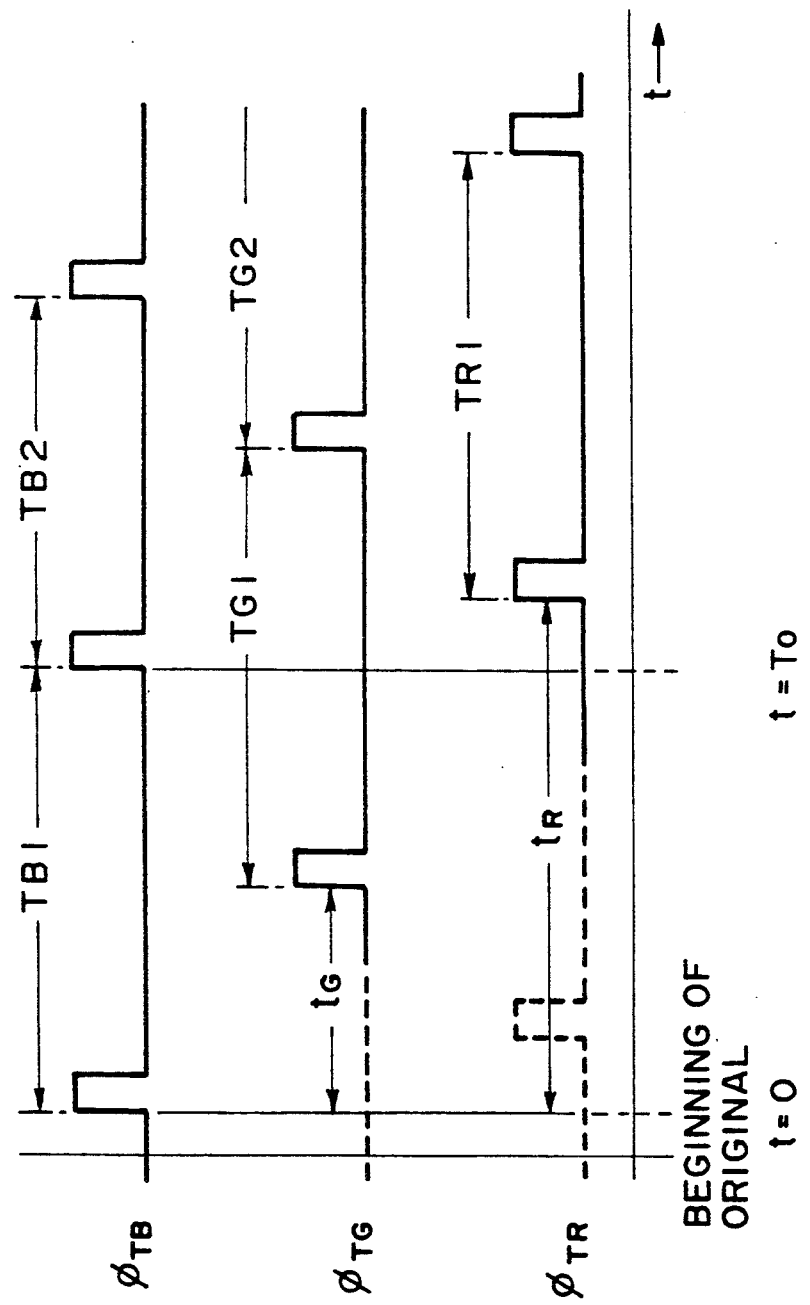

FIGS. 5A and 5B are explanatory diagrams showing another embodiment to independently drive the pixel lines A, B, and C. FIG. 5A is a schematic explanatory diagram. FIG. 5B is a timing chart. Even in FIG. 5B, only the pulses $\phi_{TR}$, $\phi_{TG}$, and $\phi_{TB}$ are shown for simplicity of the drawing.

As shown in FIG. 5A, it is assumed that the photoelectric conversion devices shown in FIG. 2 move at a constant velocity v and color image information of an original is read. For instance, the B pixels obtain the original information (information amount: $T_{B1}$) for the period of time from time $t=0$ to time $t=T_0$. Assuming that the distance between pixel lines is set to d, the original information which is obtained by the G pixels is input with only a delay time $t=d/v$ (information amount: $T_{G1}$). Similarly, the original information which is obtained by the R pixels is input with only a delay time $t=2d/v$ (information amount: $TB_1$).

As shown in FIG. 5B, the generation timings of the drive pulses $\phi_{TG}$ and $\phi_{TR}$ of G and R are phaseshifted by only a time $t_G (=d/v)$ and a time $t_R (=2d/v)$ (it is assumed that all of the periods $T_0$ of the pulses $\phi_{TB}$, $\phi_{TG}$, and $\phi_{TR}$ are the same). Thus, the information amounts which are obtained from the original by the R, G, and B pixels are equal ($TB_1 = TG_1 = TR_1$, $TB_2 = TG_2 = TR_2$, ... In FIG. 5, although $TB_1$, $TG_1$, TR₁ are not equal to TB₂, TG₂, and TR₂, it is also possible to set such that TB₁, TG₁, TR₁=TB₂, TG₂, TR₂), so that the correct color information is derived. In this case, when the scanning velocity v of the photoelectric conversion device changes, $t_G$ and $t_R$ also change. However, according to the invention in which the R, G, and B pixel lines can be independently driven, the phases can be easily controlled by changing the times $t_G$ and $t_R$.

An example of an image reading apparatus to which the invention is applied will now be explained.

Figure 6:
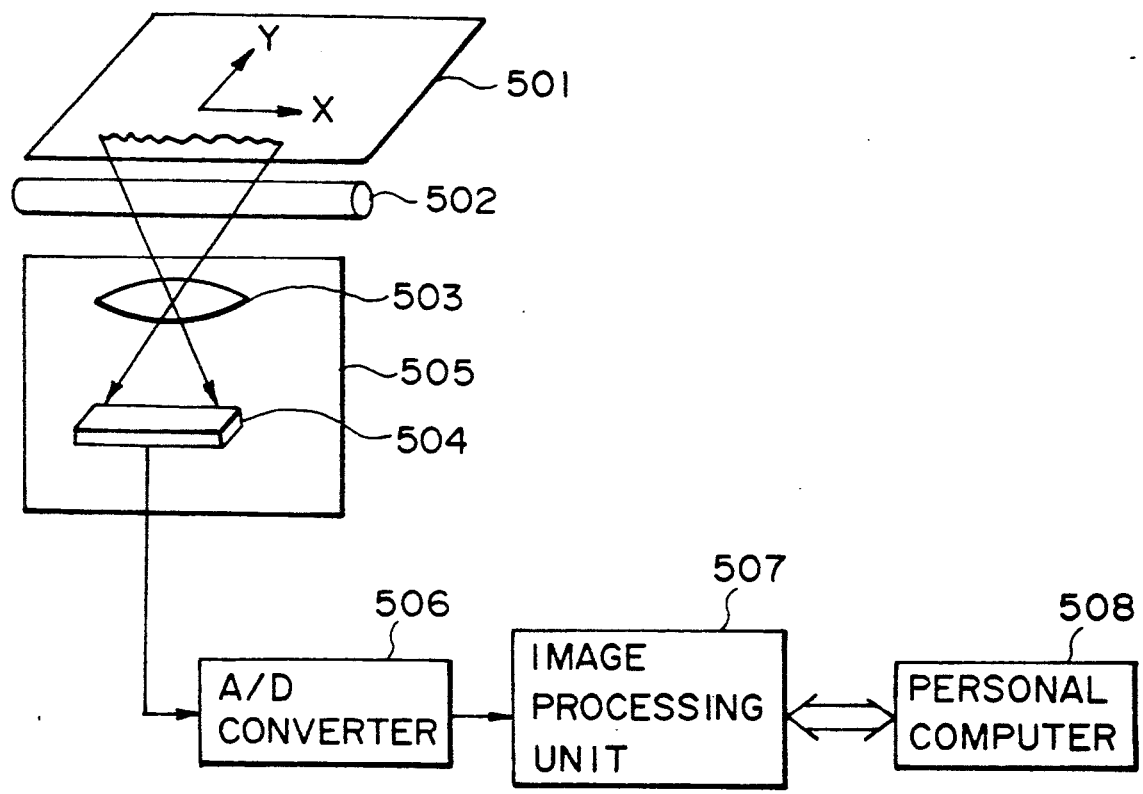
FIG. 6 is a schematic constructional diagram of an example of an image reading apparatus.
Figure 7A:
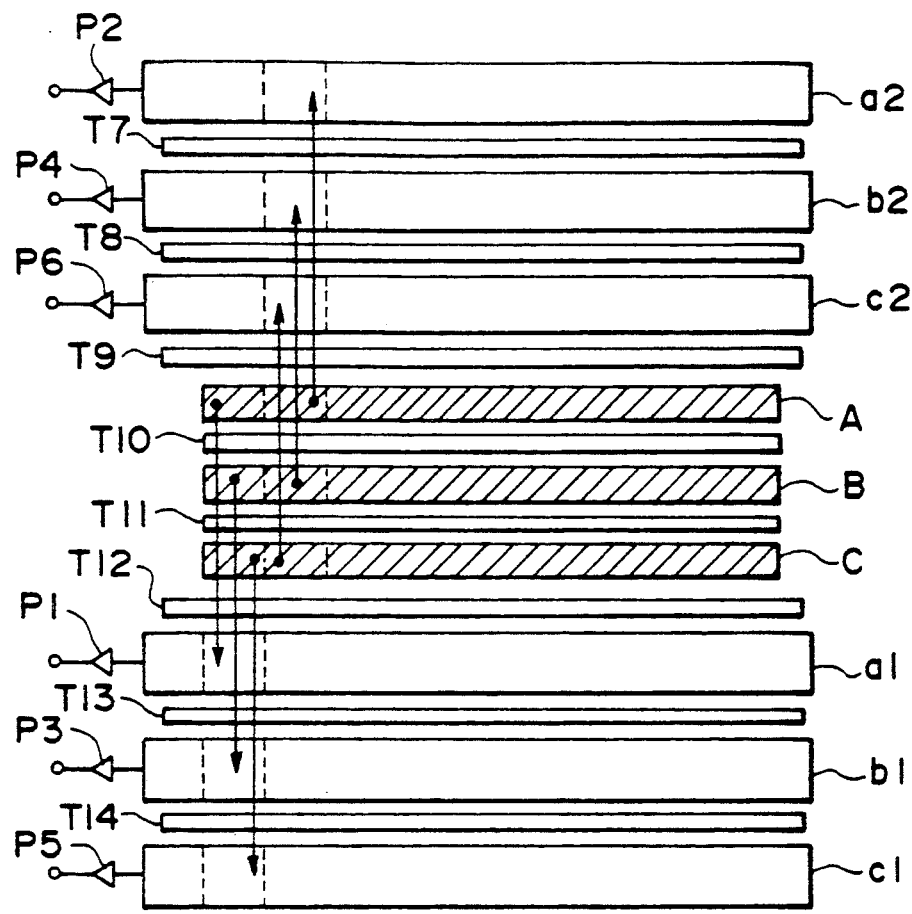
FIG. 7A is an explanatory diagram of a construction of a conventional photoelectric converting apparatus.
Figure 7B:
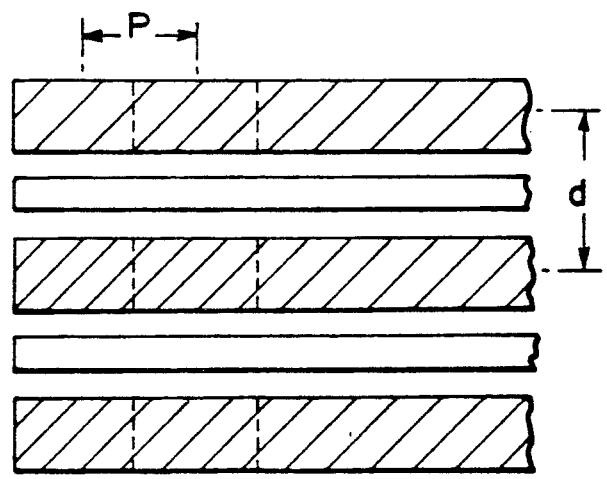
FIG. 7B is a partial enlarged diagram of the photoelectric converting apparatus of FIG. 7A.

FIG. 6 is a schematic constructional diagram of an example of the image reading apparatus.

In the diagram, an original 501 relatively mechanically moves in the direction of an arrow Y for a reading section 505. An image sensor 504 such as the photoelectric converting apparatus of the invention scans on the original in the direction of an arrow X, so that an image is read.

First, the light from a light source 502 is reflected by the original 501 and its reflected lights are transmitted through an image forming optical system 503 and an image is formed onto the image sensor 504. Thus, carriers corresponding to the intensity of the incident light are accumulated into the image sensor 504 and are photoelectrically converted and are output as an image signal.

The image signal is converted into the digital signal by an A/D converter 506 and is stored as image data into a memory provided in an image processing unit 507. The processes such as shading correction, color correction, and the like are executed The processed image signal is transmitted to a personal computer 508 or a printer or the like.

After completion of the image signal transfer by the scanning in the X direction, the original 501 relatively moves in the Y direction. By repeating the similar operations after that, a pre-image of the original 501 is converted into the electric signal and can be extracted as image information.

As described in detail above, according to the photoelectric converting apparatus of the invention, the following advantages can be obtained.

(1) Since three pixel lines can be independently driven, the charge storage periods of the pixel lines can be freely controlled and the phases of the operations of the pixel lines can be also shifted.

(2) There is no need to provide any transfer gate among the pixel lines. The distance between pixel lines can be reduced as compared with that in the conventional example.

I claim:

1. A photoelectric conversion apparatus comprising:
   (a) a plurality of photoelectric conversion device lines, each for accumulating a photoelectrically converted signal;
   (b) scanning means for independently scanning each of said plurality of photoelectric conversion device lines and receiving each of the photoelectrically converted signals accumulated in the scanned photoelectric conversion device lines; and
   (c) connecting means for connecting said plurality of photoelectric conversion device lines and said scanning means by wirings through which the photoelectrically converted signals accumulated in said plurality of photoelectric conversion device lines are respectively transferred to said scanning means according to an operation of said scanning means.

2. An apparatus according to claim 1, wherein said plurality of photoelectric conversion device lines include a plurality of color line sensors to form different color signals.

3. An apparatus according to claim 2, wherein said plurality of color line sensors include three color line sensors to form R, G, and B, respectively.

4. An apparatus according to claim 1, wherein each of said plurality of photoelectric conversion device lines has a plurality of pixels and each of said pixels includes a transistor for amplification.

5. An apparatus according to claim 1, further having memory means between said scanning circuits and said plurality of photoelectric conversion device lines.

6. An apparatus according to claim 5, wherein said memory means includes a capacitor.

7. A color reading apparatus comprising:
   (a) a plurality of line sensors for accumulating photoelectrically converted signals;
   (b) displacing means for relatively displacing said plurality of line sensors and an object; and
   (c) scanning means connected with said plurality of line sensors, for independently scanning each of said plurality of line sensors and for reading out the photoelectrically converted signals accumulated in the scanned line sensor from the line sensor to said scanning means.

8. An apparatus according to claim 7, wherein said plurality of line sensors are color line sensors to detect different colors, respectively.

9. An apparatus according to claim 8, wherein said plurality of color line sensors include three color line sensors to form R, G, and B, respectively.

10. An apparatus according to claim 7, wherein each of said line sensors includes a plurality of pixels and each of said pixels includes a transistor for amplification.

11. An apparatus according to claim 7, further having memory means between said plurality of line sensors and said plurality of scanning means.

12. An apparatus according to claim 11, wherein said memory means includes a capacitor.

13. A photoelectric converting apparatus comprising:
   (a) a plurality of photoelectric conversion device lines for photoelectrically converting a light from an object into electrical signals;
   signal read-out means for independently reading out the electrical signal from each of said plurality of photoelectric conversion device lines and for outputting the read-out signal; and
   (c) a plurality of signal transferring means for connecting said plurality of photoelectric conversion device lines and said plurality of signal read-out means, wherein the electrical signals read out by said read-out means from said plurality of photoelectric conversion device lines are transferred to said signal read-out means respectively through said plurality of signal transferring means.

14. A photoelectric converting apparatus according to claim 13, wherein at least said plurality of photoelectric conversion device lines and said plurality of signal readout means are formed on a single substrate.

15. A photoelectric converting apparatus according to claim 13, wherein said signal read-out means includes a scanning circuit and temporal storage means for temporally storing the photoelectrically converted signal.

16. A photoelectric converting apparatus according to claim 15, wherein said temporal storage means includes a plurality of capacitors corresponding to a plurality of photoelectric conversion devices which constitute the photoelectric conversion device lines.

17. A photoelectric converting apparatus according to claim 16, wherein the photoelectric conversion device includes a transistor for amplification.

18. A photoelectric converting apparatus according to claim 13, wherein said plurality of photoelectric conversion device lines includes a plurality of color line sensors to form different color signals.

19. A photoelectric converting apparatus according to claim 18, wherein said plurality of color line sensors includes three color line sensors to form R, G and B signals, respectively.

* * * * *

UNITED STATES PATENT AND TRADEMARK OFFICE
CERTIFICATE OF CORRECTION

PATENT NO. : 5,128,533

DATED : July 7, 1992

INVENTOR(S) : TAKAHIRO OGUCHI, ET AL.

It is certified that error appears in the above-identified patent and that said Letters Patent is hereby corrected as shown below:

Title Page:
Item [56] REFERENCES CITED:

U.S. Patent Documents,
"4,764,813 8/1988 Murajama et al." should read
--4,764,813 8/1988 Murayama et al.--

Foreign Patent Documents,
"61-255062 8/1985 Japan" should read
--61-255062 1 /1986 Japan--.

COLUMN 4

Line 60, "TB,)." should read --$TR_1$)--.
Line 62, "phaseshifted" should read --phase-shifted--.

COLUMN 5

Line 31, "executed" should read --executed.--.

Signed and Sealed this

Twenty-first Day of December, 1993

Attest:

BRUCE LEHMAN

*Attesting Officer*    *Commissioner of Patents and Trademarks*